(12) United States Patent
Nakata

(10) Patent No.: US 7,198,672 B2
(45) Date of Patent: Apr. 3, 2007

(54) DROP TUBE TYPE GRANULAR CRYSTAL PRODUCING DEVICE

(76) Inventor: Josuke Nakata, 29-3, Goryoooeyama-cho, 4-chome, Nishikyo-ku, Kyoto-shi, Kyoto, 610-1102 (JP)

( * ) Notice: Subject to any disclaimer, the term of this patent is extended or adjusted under 35 U.S.C. 154(b) by 371 days.

(21) Appl. No.: 10/511,961

(22) PCT Filed: May 13, 2002

(86) PCT No.: PCT/JP02/04620

§ 371 (c)(1),
(2), (4) Date: Nov. 10, 2004

(87) PCT Pub. No.: WO03/095719

PCT Pub. Date: Nov. 20, 2003

(65) Prior Publication Data

US 2006/0070652 A1 Apr. 6, 2006

(51) Int. Cl.
 *C30B 11/00* (2006.01)
(52) U.S. Cl. .................. 117/205; 117/11; 117/12; 117/200; 117/901
(58) Field of Classification Search .......... 117/12, 117/11, 200, 205, 901
See application file for complete search history.

(56) References Cited

U.S. PATENT DOCUMENTS

| 4,021,323 | A | 5/1977 | Kilby et al. |
| 4,322,379 | A | 3/1982 | Kilby et al. |
| 6,106,614 | A | 8/2000 | Stephens et al. |
| 6,204,545 | B1* | 3/2001 | Nakata ............... 257/459 |
| 6,264,742 | B1 | 7/2001 | Vekris et al. |
| 6,294,822 | B1* | 9/2001 | Nakata ............... 257/461 |
| 6,319,314 | B1* | 11/2001 | Shoei ............... 117/206 |
| 2003/0080451 | A1* | 5/2003 | Kitahara et al. ....... 264/7 |

FOREIGN PATENT DOCUMENTS

| EP | 0 947 613 | 10/1999 |
| JP | 10-33969 | 2/1998 |
| JP | 10-033969 | * 10/1998 |

OTHER PUBLICATIONS

Takashi Tsurue et al., Production of Spherical Germanium by Drop Tubes. The Japan Society of Microgravity Application, vol. 15, Supplement, 1998, pp. 53 to 54.

* cited by examiner

*Primary Examiner*—Robert Kunemund
(74) *Attorney, Agent, or Firm*—Jordan and Hamburg LLP

(57) ABSTRACT

A drop tube type particulate crystalline body producing device is a device for creating a substantially spherical crystalline body by solidifying a particulate melt of an inorganic material while allowing it to free-fall inside a drop tube. This device 1 has a melt formation device 2, drop tube 3, gas flow formation means for forming inside the drop tube 3 a gas flow of cooling gas, and recovery mechanism 5 for recovering a crystalline body 25a from the lower end of the drop tube 3. The drop tube 3 comprises an introducing tube 30, cooling tube 31, and solidification tube 32, where the cooling tube 31 is configured such that the cross sectional area thereof becomes smaller toward the bottom such that the cooling gas flow speed becomes substantially equal to the free fall speed of the particulate melt, and the solidification tube 32 is connected to the lower end of the cooling tube 31 and has a cross sectional area enlarged discontinuously from the lower end of the cooling tube 31. In a proximity of the upper end of the solidification tube 32, the flow speed of the cooling gas is rapidly reduced and the gas pressure increases, whereby a crystal nucleus is generated in the melt in a supercooled state, and the melt is crystallized at once.

12 Claims, 2 Drawing Sheets

DROP TUBE TYPE GRANULAR CRYSTAL PRODUCING DEVICE

TECHNICAL FIELD

The present invention relates to a drop tube type particulate crystalline body producing device for creating a substantially spherical crystalline body by solidifying a particulate melt of an inorganic material while allowing it to free-fall inside a drop tube, and more particularly relates to a drop tube type particulate crystalline body producing device which is configured to flow cooling gas for cooling the falling melt in the same direction as the falling direction of the melt at substantially an equal speed.

BACKGROUND OF THE INVENTION

The U.S. Pat. No. 4,322,379 discloses a technology for producing tear-drop shaped crystals of substantially uniform size, in which semiconductor silicon is heated inside the upper end portion of a drop tube made of quartz in order to obtain a melt, the gas pressure of helium gas is caused to act on this melt, and the particulate melt thus obtained is allowed to free-fall inside the drop tube and solidified during the free fall. However, the particulate melt does not go into microgravity because it receives the drop resistance of the gas inside the drop tube.

The inventor of the present application has disclosed a drop tube type spherical crystal producing device capable of producing particulate semiconductor single crystals, as indicated in the U.S. Pat. No. 6,204,545. In this spherical crystal producing device, a semiconductor particulate is turned into a melt in a floating state in the upper end portion of an approximately 14-meter-long drop tube, and this melt is allowed to free-fall inside the drop tube and is solidified in microgravity while falling, by means of radiation cooling, to obtain a spherical semiconductor single crystal. The drop tube of this spherical crystal producing device is configured to have the same diameter throughout the length thereof, but not to cool the melt by using cooling gas.

In such kind of spherical crystal producing device, a particulate melt is merely cooled by means of radiation cooling, which takes a long cooling time and requires a tall drop tube, thus equipment cost becomes expensive. Moreover, it is difficult to cool all over the melt evenly. In a case of a melt of silicon or the like, the melt has a property of expanding when being solidified, thus, cooling the whole melt unevenly distorts the shape of a solidified spherical crystal easily.

In the U.S. Pat. No. 6,106,614, a drop tower type spherical crystal producing device is proposed. In this device, a crucible made of quartz is provided on the upper end side of a drop tower, a powdery semiconductor (for example, semiconductor silicon) is supplied to the crucible from the outside, and at the same time the semiconductor is melted, and vibration is added to the melt inside the crucible by a vibration adding mechanism, whereby a particulate melt is allowed to fall inside the drop tower from a nozzle on the lower end of the crucible. In a nucleation zone at the mid section of the drop tower, there are provided cooling gas flow formation means for generating a flow of cooling inert gas going from bottom to top, and seed crystal generation means for generating a seed crystal in the falling particulate melt. The particulate melt falling inside the drop tower is cooled to a supercooled state in the nucleation zone by means of cooling gas, and when the seed crystal generation means generates a seed crystal by adding a stimulus to the particulate melt that is in the supercooled state, the particulate melt is solidified and becomes a spherical crystal. In the lower part of the drop tower, a momentum dissipation zone for dissipating the momentum of the spherical crystal is provided, and this momentum dissipation zone is provided with a curved path which changes the direction of motion of the spherical crystal from the vertical direction to the horizontal direction, and gas flow formation means for reducing the speed, which generates an inert gas flow going from bottom to top.

However, in the spherical crystal producing device of this patent publication, a flow of the cooling gas going toward opposite the falling direction of the melt acts on the falling particulate melt inside the nucleation zone, thus the falling state of the melt becomes a different free falling state. Also an external force acts on the falling particulate melt, thus the structure within the melt easily fluctuates, and the shape of the solidified spherical crystal easily distorts. Thus a single crystal is not necessarily obtained.

The object of the present invention is to provide a drop tube type particulate crystalline body producing device capable of maintaining microgravity created by the free fall of the melt while cooling the particulate melt by means of cooling gas. Another object of the present invention is to provide a drop tube type particulate crystalline body producing device capable of creating a seed crystal by applying an impact to the melt in a supercooled state by means of cooling gas.

A further object of the present invention is to provide a drop tube type particulate crystalline body producing device capable of shortening the height of a drop tube through cooling by means of cooling gas.

Yet another object of the present invention is to provide a drop tube type particulate crystalline body producing device for reducing gas consumption by circulating the cooling gas and for stabilizing the gas pressure by being able to control it.

DISCLOSURE OF THE INVENTION

A drop tube type particulate crystalline body producing device according to the present invention, which creates a substantially spherical crystalline body by solidifying a particulate melt of an inorganic material while allowing it to free-fall inside a drop tube, is provided with gas flow formation means for forming inside the drop tube a flow of cooling gas going from top to bottom, and the drop tube has a cooling tube, the cross sectional area of which becomes smaller toward the bottom such that the cooling gas flow speed becomes substantially equal to the fall speed of the particulate melt, and a solidification tube which is connected to the lower end of the cooling tube and has a cross sectional area enlarged discontinuously from the lower end of the cooling tube.

The cooling gas flow going from top to bottom is formed inside the drop tube by means of the gas flow formation means. The cooling tube among the drop tube has a cross sectional area which becomes smaller toward the bottom such that the cooling gas flow speed becomes substantially equal to the free fall speed of the melt, thus the cooling gas flow speed becomes substantially equal to the fall speed of the melt in the cooling tube. Therefore, during the fall of the melt inside the cooling tube, the particulate melt is cooled by the cooling gas while maintaining microgravity created by the free fall and goes into a supercooled state.

The solidification tube in the drop tube is connected to the lower end of the abovementioned cooling tube and has a cross sectional area enlarged discontinuously from the lower end of the cooling tube. Therefore, when the cooling gas enters the solidification tube from the cooling tube, the flow speed thereof is discontinuously reduced, and the gas pressure of the cooling gas is discontinuously reduced. Consequently, once the melt in microgravity and in the supercooled state enters into the solidification tube, an impact force acts on the melt, whereby a crystalline nucleus is generated, at which point the spherical melt is single-crystallized immediately and becomes a substantially spherical crystalline body.

As above, the particulate melt is cooled by the cooling gas, and since the melt maintains the free fall state where gas resistance is low, the substantially spherical single-crystallized crystalline body can be produced. Further, an impact is applied to the particulate melt brought into the supercooled state by means of the cooling gas to generate the crystalline nucleus, whereby crystal is imposed at once and a crystalline body can be produced. Moreover, in order to effectively cool the melt by means of the cooling gas, the cooling time can be reduced and the height of the drop tube can be significantly shortened, thereby cutting down equipment cost.

Now, the various configurations may be applied to the present invention.

(a) The gas flow formation means is provided with an external path connected in parallel to the drop tube, and a gas circulating fan.

(b) An annular gas introducing portion connected to the external path is provided at the upper end portion of the drop tube.

(c) A speed reducing mechanism for rapidly reducing the cooling gas flow speed is provided inside the solidification tube.

(d) The speed reducing mechanism has a partially spherical speed reducing member which includes a facing portion orthogonally facing the gas flow of the cooling gas inside the cooling tube.

(e) The semiconductor particulate melt is brought into a supercooled sate when falling inside the cooling tube and is rapidly solidified by the impact when the fall speed is rapidly reduced inside the solidification tube.

(f) The gas flow formation means is provided with a cooling device for cooling the cooling gas.

(g) The inorganic material is a semiconductor. The semiconductor is silicon.

(h) The cooling gas is helium gas or argon gas.

(i) The gas flow formation means has pressure-temperature adjusting means for adjusting the gas pressure and temperature of the cooling gas inside the drop tube.

(j) A melt formation device for creating a particulate melt and dropping it into the drop tube is provided, the melt formation device being connected to the upper end of the drop tube.

PREFERRED EMBODIMENT OF THE INVENTION

Hereinbelow, the best mode for implementing the present invention will be described with reference to the drawings.

This drop tube type particulate crystalline body producing device melts the raw material of an inorganic material in a crucible, drops the particulate melt from a nozzle, and solidifies a particulate melt while allowing it to free fall inside the drop tube to continuously produce a substantially spherical crystalline body consisting of a single crystal with the inorganic material. The substantially spherical crystalline body has a diameter of approximately 600 to 1500 µm.

The present embodiment relates to a drop tube type particulate crystalline body producing device 1 as an example, in which a semiconductor is employed as the inorganic material, and p-type or n-type silicon is employed as the semiconductor, to produce a substantially spherical crystalline body with a silicon single crystal.

Figure 1:
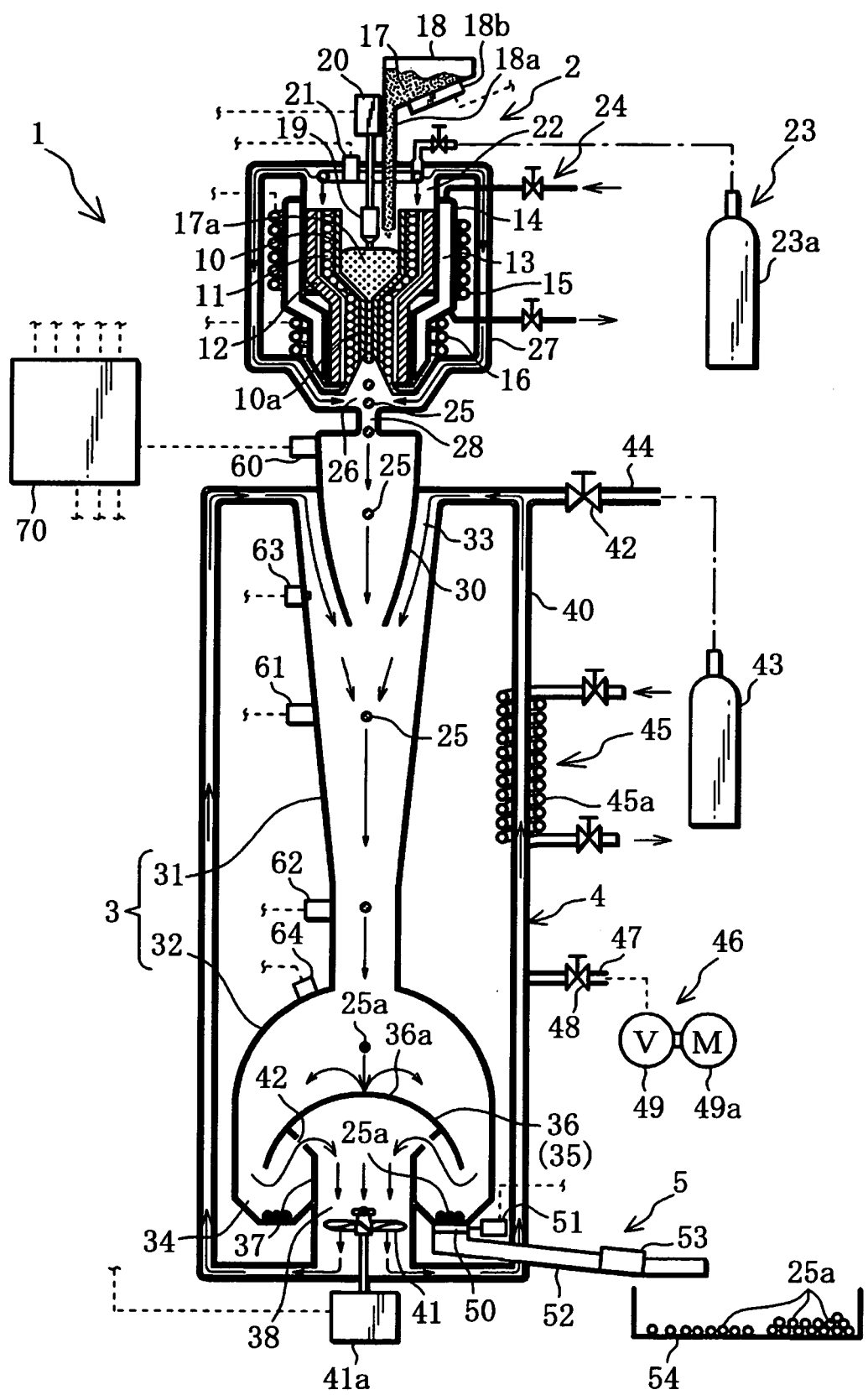
FIG. 1 is a cross sectional view of the drop tube type particulate crystalline body producing device according to an embodiment of the present invention.

As shown in FIG. 1, the drop tube type particulate crystalline body producing device 1 comprises a melt formation device 2 where silicon is melted and a fixed amount of the melt thus obtained is formed into a particulate melt and dropped, a drop tube 3, a gas flow formation mechanism 4 for forming inside the drop tube 3 a cooling gas flow going from top to bottom, and a recovery mechanism 5 provided at the lower portion of the drop tube 3.

First of all, the melt formation device 2 will be described.

This melt formation device 2 comprises a quartz crucible 10, a nozzle 10a extending integrally downward from the lower end portion of the crucible 10, a carbon heat generator 11 for covering the crucible 10 and the outer circumference of the nozzle 10a, a heat shield sheet 12 for covering the outer circumference of the carbon heat generator 11, an annular path formation body 14 which is made of quartz glass and forms an annular cooling water path 13, a first high frequency heating coil 15 disposed on the outer circumference side of the crucible 10 on the outside of the path formation body 14, a second high frequency heating coil 16 disposed on the outer circumference side of the nozzle 10a on the outside of the path formation body 14, a raw material supply hopper 18 and raw material supply tube 18a for supplying a raw material of silicon 17 to the crucible 10, a vertical vibrator 19 for applying vertical vibration to the silicon in a molten state within the crucible 10, an infrared temperature sensor 21 for measuring the temperature of silicon 17a in a molten state within the crucible 10, a gas supply device 23 for supplying inactive gas, such as helium gas or argon gas, to a chamber 22, and a cooling water supply system 24 for supplying cooling water to a cooling water path 13, etc.

The raw material supply hopper 18 contains the raw material of semiconductor silicon 17 in a form of powder, particle, or flake, and applies vibration to the raw material 17 by means of a vibration generator 18b and supplies the raw material 17 from the supply tube 18a to the crucible 10 at a predetermined speed of supply little by little. The supply tube 18a is provided with a gas path that leads inert gas within the chamber 22 into the raw material supply hopper 18.

The crucible 10 is placed inside the chamber 22 having an airtight structure. In the chamber 22, inert gas supplied from the gas supply device 23 is filled such that oxygen in the air is not mixed with the raw material of silicon 17 or the melt 17a. In the carbon heat generator 11, an induced current is generated by a fluctuating magnetic field with a high frequency generated in the first and second high frequency heating coils 15 and 16, and the carbon heat generator 11 generates heat by resistance heat generated when this induced current flows. The shield sheet 12 is constituted by a molybdenum or tantalum with excellent heat resistance and radiant heat reflecting properties.

The raw material of silicon 17 fed into the crucible 10 is applied with heat of approximately 1420 degrees centigrade by the first high frequency heating coil 15 and carbon heat generator 11 and melts. The temperature of the silicon in a molten state is then detected by the infrared temperature sensor 21, and a control device 70 controls the first and second high frequency heating coils 15, 16 so as to maintain the range of the above temperature. The vertical vibrator 19 is driven in the vibration generating portion 20 generating vibration by means of a magnetostrictor or solenoid and applies vibration or pressure in a predetermined cycle to the silicon 17a in the molten state within the crucible 10, thereby dropping a particulate melt 25 of the silicon from the edge of the nozzle 10a. The particulate melt 25 is reduced at its diameter when shortening the vibration cycle of the vertical vibrator 19 or reducing the amplitude of the vibration, and on the other hand the diameter of the particulate melt is increased when extending the vibration cycle or increasing the amplitude of the vibration, thus the control device 70 controls the vertical vibrator 19, whereby the size of the particulate melt 25 to be dropped is adjusted by adjusting the vertical vibration cycle or amplitude.

The gas supply device 23 has a gas supply tube communicated from a inert gas bottle 23a to the chamber 22, and two, for example, of a gas introducing tube 27 communicating to a falling start chamber 26 by extending downward from the top portion of the chamber 22. The particulate melt 25, which was dropped from the nozzle 10a into the falling start chamber 26, free-falls into the top of the drop tube 3 via a narrow path 28 which is an exit path of the melt formation device 2. The inert gas within the falling start chamber 26 also flows into the top of the drop tube 3 via the narrow path 28.

Secondly, the drop tube 3 will be described.

The drop tube 3 has a shape of a pipe made of stainless steel sheet, for example, and has an introducing tube 30, at the upper end portion, which is connected to the narrow passage 28 and to which the particulate melt 25 is introduced, a cooling tube 31, the cross sectional area of which becomes smaller toward the bottom such that the cooling gas (helium gas or argon gas) flow speed becomes substantially equal to the free fall speed of the particulate melt 25, and a solidification tube 32, which is connected to the lower end of the cooling tube 31 and the cross sectional area of which is discontinuously enlarged from the lower end of the cooling tube 31.

The particulate melt 25 generated in the melt formation device 2 is cooled by the cooling gas during the free fall inside the cooling tube 31 and also is cooled by radiation cooling and thereby goes into a supercooled state, and moreover falls into the solidification tube 32. A seed crystal is generated by the impact when landing on the cooling gas inside the solidification tube 32, which has a higher pressure than the gas pressure of the cooling gas inside the cooling tube 31, and then the particulate melt 25 becomes a crystalline body 25a consisting of a particulate or spherical single crystal due to instantaneous crystal growth originating the seed crystal.

The portions other than the lower end portion of the above cooling tube 31 is configured with a tapered shape such that the diameter thereof becomes smaller toward the bottom, and the lower end portion of the cooling tube 31 is configured to have a substantially uniform diameter. However, the lower end portion of this cooling tube 31 may also be configured with a tapered shape such that the diameter thereof becomes smaller toward the bottom.

The introducing tube 30 is disposed coaxially with the cooling tube 31, and two thirds of the lower section of the introducing tube 30 is inserted into the upper end portion of the cooling tube 31, and the lower end of the introducing tube 30 is opened toward the inside the cooling tube 31.

The cooling tube 31 has a height of approximately 5 to 8 meters, and there is formed inside the upper end portion thereof an annular gas introducing portion 33 for introducing cooling gas between the introducing tube 30 and the upper end portion of the cooling tube 31. The upper end of the solidification tube 32 is communicably connected to the lower end of the cooling tube 31, the upper half portion of the solidification tube 32 is configured to have a semispherical shape with a diameter that is four times larger than that of the lower end portion of the cooling tube 31, while the lower half portion of the solidification tube 32 is configured to have a cylindrical shape with a diameter same as that of the upper half portion of the solidification tube 32, and the lower end of the solidification tube 32 is provided with a base wall 34.

The cross sectional area of the solidification tube 32 is discontinuously large all of a sudden, compared to the cross sectional area of the lower end of the cooling tube 31. Therefore when the cooling gas flow speed is discontinuously reduced suddenly once entering the solidification tube 32, and further, a speed reducing mechanism 35 for rapidly reducing the cooling gas flow speed is provided inside the lower half portion of the solidification tube 32. This speed reducing mechanism 35 has a partially spherical reducing member 36 which includes a facing portion 36a orthogonally facing the gas flow of the cooling gas inside the cooling tube 31. This speed reducing member 36 is constituted by a stainless steel sheet having a thickness of 0.1 to 0.2 mm, and offers a cushion effect caused by elastic deformation. The particulate (spherical) crystalline body 25a produced by solidifying the particulate melt 25 is caused to collide gently inside the upper half portion of the solidification tube 32. The lower face side of the speed reducing member 36 is provided with a cylinder 37 which supports the speed reducing member 36 and forms a path for the cooling gas.

A gas flow formation mechanism 4 will be described next.

The gas flow formation mechanism 4 is for forming, inside the drop tube 3, a flow of the cooling gas (helium gas or argon gas) going from upward to downward. The gas flow formation mechanism 4 comprises a plurality of (for example, four) external paths 40 connected parallel to the drop tube 3, and a gas circulation fan 41 disposed inside the cylinder 37.

The upper ends of the plurality of external paths 40 are communicably connected to the annular gas introducing portion 33, while the lower ends of the plurality of external paths 40 are communicated to a gas path 38 inside the cylinder 37, and in the upper portion of the cylinder 37 there are formed a plurality of path openings 42 introducing the cooling gas within the lower half portion of the solidification tube 32 to the gas path 38. The cooling gas, such as helium gas or argon gas, is introduced by a gas supply tube 44 from the bottle 43 to the upper end portion of the external path 40, with an open-close valve 42 opened, if necessary. A cooling device 45 for cooling the cooling gas is provided, since the cooling gas flowing inside the drop tube 3 is heated up gradually. This cooling device 45 is constituted by a water cooling tube 45a mounted on the outside of the external path 40, and a water supply system for supplying cooling water to the water cooling tube 45a.

Further, a pressure adjustment device 46 (pressure adjusting means) for adjusting the gas pressure of the cooling gas inside the drop tube 3 is provided. This pressure adjustment device 46 is constituted by a suction tube 47 connected to the external path 40, an open-close valve 48, a vacuum pump 49 and a drive motor 49a thereof etc.

Next, a recovery mechanism 5 for recovering the crystalline body 25a will be described. The recovery mechanism 5 has an open-close shutter 50 for opening and closing a recovery hole on the base wall 34 of the solidification tube 32, a solenoid actuator 51 for driving the open-close shutter 50, a recovery duct 52 extending from the bottom of the recovery hole to the exterior, a shutter valve 53 capable of opening and closing the recovery duct 52, and a recovery box 54a for recovering the crystalline body 25a discharged from the recovery duct 52.

The sensors and control systems will be described next.

First of all, as for the sensors, provided are an infrared temperature sensor 60 for measuring the temperature of the particulate melt 25 immediately after falling from the falling start chamber 26, an infrared temperature sensor 61 for measuring the temperature of the particulate melt 25 when falling in the midstream portion of the cooling tube 31, an infrared temperature sensor 62 for measuring the temperature of the particulate melt 25 when falling the lower end portion of the cooling tube 31, a temperature sensor 63, such as a thermistor, for measuring the temperature of the cooling gas inside the introducing path 33, a pressure sensor 64 for detecting the gas pressure of the cooling gas inside the solidification tube 32, and other sensors. Detected signals of these sensors and the infrared temperature sensor 21 in the melt formation device 2 are outputted to the control device 70.

The first and second high frequency heating coils 15 and 16, vibration generator 18b, and vibration generating portion 20 of the vertical vibrator 19 in the melt formation device 2 are controlled in driving operation by the control device 70.

Moreover, a drive motor 41a driving the gas circulating fan 41, the drive motor 49a for the vacuum pump 49, solenoid actuator 51, and shutter valve 53 are also controlled in driving operation by the control device 70.

Next, functions and advantages of the above drop tube type particulate crystalline body producing device 1 will be described.

Before starting to use the drop tube type particulate crystalline body producing device 1, after suction the air inside the drop tube 3 or external path 40 by means of the vacuum pump 49 while supplying inert gas into the chamber 22 of the melt formation device 2, cooling gas is supplied from the bottle 43 and gas supply tube 44, whereby the air inside is substituted with the cooling gas, such as helium gas or argon gas, to make the gas pressure of the cooling gas inside the drop tube 3 be a predetermined pressure equal to or less than ambient pressure or a predetermined pressure of substantially the ambient pressure.

Thereafter, the cooling water is circulated in the cooling water path 13, the raw material of silicon 17 is supplied to the crucible 10, a high frequency current is supplied to the first and second high frequency heating coils 15 and 16 to start heating in a state where the gas circulating fan 41 is activated, and when the raw material 17 goes into a molten state, the vertical vibrator 19 is vibrated in a predetermined cycle and the particulate melt 25 is sequentially dropped from the nozzle 10a.

The cooling tube 31 in the drop tube 3 is configured such that the cross sectional area thereof is gradually reduced downward so that the flow speed of the cooling gas flowing inside the cooling tube 31 becomes a free fall speed of the particulate melt 25. Therefore, when the particulate melt 25 free-falls inside the cooling tube 31, the cooling gas also flows downward at substantially the same speed as the particulate melt 25, thus a relative speed between the free-falling particulate melt 25 and the cooling gas is hardly generated. Although the particulate melt 25 is cooled effectively by the cooling gas, an external force hardly acts on the particulate melt 25 from the cooling gas. When the particulate melt 25 free-falls inside the cooling tube 31, the particulate melt 25 falls while maintaining microgravity created by the free fall without being affected by the gravity or external force, thus the particulate melt 25 falls, keeping substantially a spherical shape through the surface tension. Moreover, the particulate melt 25 is cooled to a supercooled state before reaching the lower end of the cooling tube 31.

Here, in comparison to the cross sectional area of the lower end portion of the cooling tube 31, the cross sectional area of the solidification tube 32 is discontinuously large all of a sudden, thus the cooling gas flow speed is suddenly discontinuously reduced once entering the solidification tube 32, and is also rapidly reduced by the speed reducing member 36 having the facing portion 36a orthogonally facing the gas flow of the cooling gas inside the cooling tube 31. Therefore, the gas pressure of the cooling gas inside the solidification tube 32 discontinuously increases all of a sudden, compared to the gas pressure of the cooling gas at the lower end portion of the cooling tube 31. Consequently, a slight impact force acts on the particulate melt 25 that fell into the solidification tube 32. Then, a crystal nucleus is generated at the point where the particulate melt 25 first collides, whereby crystallization proceeds immediately, starting at this crystal nucleus, and the particulate melt 25, which is in the supercooled state until it reaches the facing portion 36a, becomes the spherical crystalline body 25a consisting of a single crystal.

Note that, when relatively large particulate melt 25 or the like collides with the facing portion 36a of the speed reducing member 36 in a state where the particulate melt 25 is not crystallized enough, crystal growth progresses due to the impact of the collision, whereby the spherical crystalline body 25a consisting of a single crystal is obtained immediately.

Here, the temperature of each particulate melt 25 is detected based on the detected signals of the infrared temperature sensors 60 to 62. When the temperature of the cooling gas needs to be lowered, the cooling capacity of the cooling device 45 is elevated.

Moreover, because the fall speed of the particulate melt 25 can be calculated based on the detected signals of the infrared temperature sensors 60 to 62, when the fall speed of the particulate met 25 is higher than the free fall speed, the drive motor 41a should be controlled so as to reduce the number of revolution of the gas circulating fan 41.

As above, it is possible to produce a substantially spherical crystalline body 25a by cooling the particulate melt 25 by means of the cooling gas and supercooling it, while the particulate melt maintains the free fall state. Furthermore, an impact is applied to the particulate melt 25, which is in the supercooled state, by means of the cooling gas to generate a crystalline nucleus, thereby accelerating crystal growth, and the crystalline body 25a can be produced. Moreover, since cooling the particulate melt 25a by means of the cooling gas is performed efficiently, cooling time can be shortened, and the height of the drop tube 3 can also be shortened significantly, whereby cost of equipment can be cut.

In addition, consumption of the cooling gas is reduced due to circulation of the cooling gas, and it is possible to control the pressure or filling volume and the temperature of the cooling gas, thus the gas pressure of the cooling gas can be stabilized.

Next explained are modified examples that partially change the above example.

1) The above melt formation device 1 merely shows an example, thus a device that melts an inorganic material by means of resistance heating, infrared collecting heating, plasma, or laser beam, to generate a particulate melt therefrom, or a melt formation device provided with other heating mechanisms can be applied.

2) Because the longer the cooling time, the larger the diameter of the particulate melt becomes, the height of the cooling tube 31 in the drop tube 3 is preferably configured so that it can be changed in accordance with the size of the crystalline body to be produced.

Figure 2:
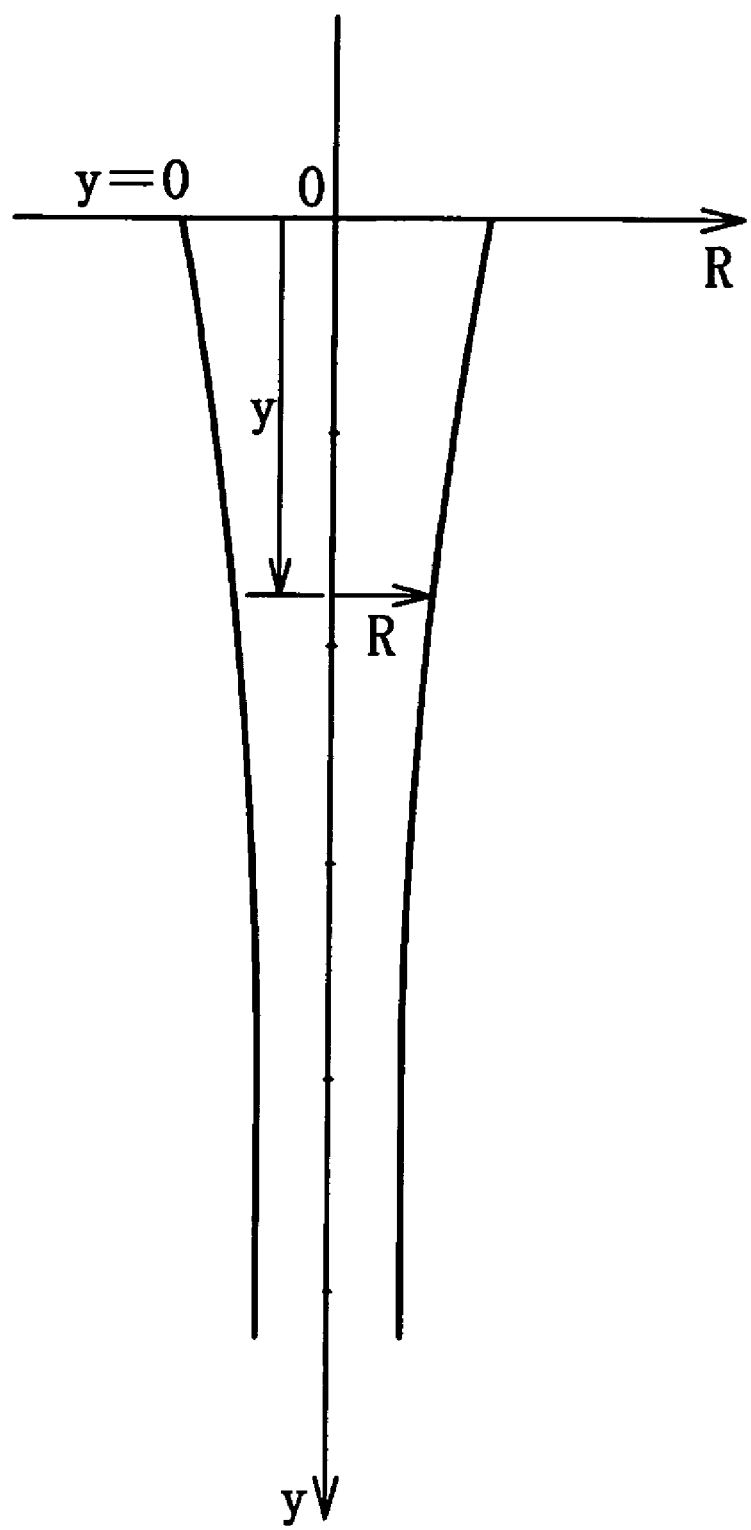
FIG. 2 is an explanatory drawing which illustrates a shape of cross section of the drop tube of a modified example.

3) The shape of the above drop tube 3 may be the shape as shown in FIG. 2.

As shown in FIG. 2, y is a distance that the melt 25 falls down inside the drop tube 3, and R is a radius of the drop tube 3 in the position of the dropping distance y. The y axis and R axis are set as shown in the figure. For example, the position of the upper end of the drop tube 3 is set to the position of y=0.

$$y=(1/2)g \times t^2 \tag{1}$$

$$Vs = g \times t \tag{2}$$

According to the equations (1) and (2), $$Vs = (2gy)^{1/2} \tag{3}$$

where g is the gravitational acceleration, t is the elapsed time after the start of falling, Vs is the fall speed of the melt 25, and V is the flow speed of the cooling gas flowing downward inside the drop tube 3 in the position of y.

When assuming a flow rate of the cooling gas to be C0 (fixed amount), $$(\pi/4)R^2 \times V = C0 \tag{4}$$

Therefore, $$V = C1/R^2 \text{(however, C1 is a fixed constant)} \tag{5}$$

When assuming that K is a fixed constant, $$R^2 \times y^{1/2} = K^2 \tag{6}$$

according to the equations (3) and (5).

The cross sectional shape of the drop tube 3 as indicated in the above equation (6) becomes as shown in FIG. 2, for example.

4) In a proximity of the lower end of the cooling tube 31 or the upper end of the solidification tube 32 in the above drop tube 3, there may be provided a means for applying various stimuli to the particulate melt 25. Any stimulant, such as a supersonic wave, laser beams, electric field, magnetic field or the like, can be employed.

5) Instead of the above semiconductor silicon crystalline body, a crystalline body with various semiconductors or various inorganic materials besides silicon can be produced. The various inorganic materials include dielectrics, magnetic materials, insulators, fluorescent materials, glasses, gemstones and the like.

The invention claimed is:

1. A drop tube type particulate crystalline body producing device for creating a substantially spherical crystalline body by solidifying a particulate melt of an inorganic material while allowing it to free-fall inside a drop tube, wherein:
    gas flow formation means for forming inside said drop tube a flow of cooling inert gas going from top to bottom is provided; and
    said drop tube has a cooling tube, the cross sectional area of which becomes smaller toward the bottom such that the cooling gas flow speed becomes substantially equal to the free fall speed of said particulate melt, and a solidification tube which is connected to the lower end of the cooling tube and has a cross sectional area enlarged discontinuously from the lower end of the cooling tube.

2. The drop tube type particulate crystalline body producing device according to claim 1, wherein said gas flow formation means is provided with an external path connected in parallel to the drop tube, and a gas circulating fan.

3. The drop tube type particulate crystalline body producing device according to claim 2, wherein an annular gas introducing portion connected to said external path is provided at the upper end portion of said drop tube.

4. The drop tube type particulate crystalline body producing device according to claim 1, wherein a speed reducing mechanism for rapidly reducing the cooling gas flow speed is provided inside said solidification tube.

5. The drop tube type particulate crystalline body producing device according to claim 4, wherein said speed reducing mechanism has a partially spherical speed reducing member which includes a facing portion orthogonally facing the gas flow of the cooling gas inside the cooling tube.

6. The drop type particulate crystalline body producing device according to claim 1, wherein said particulate melt goes into a supercooled state during its fall inside the cooling tube and is solidified rapidly by the impact when the speed is rapidly reduced inside the solidification tube.

7. The drop tube type particulate crystalline body producing device according to claim 2, wherein said gas flow formation means is provided with a cooling device for cooling the cooling gas.

8. The drop tube type particulate crystalline body producing device according to claim 1, wherein said inorganic material is a semiconductor.

9. The drop tube type particulate crystalline body producing device according to claim 8, wherein said semiconductor is silicon.

10. The drop tube type particulate crystalline body producing device according to claim 1, wherein said cooling gas is helium gas or argon gas.

11. The drop tube type particulate crystalline body producing device according to claim 1, wherein said gas flow formation means has pressure-temperature adjusting means for adjusting the gas pressure and temperature of the cooling gas inside said drop tube.

12. The drop tube type particulate crystalline body producing device according to claim 1, comprising a melt formation device for creating a particulate melt and dropping same into the drop tube, the melt formation device being connected to the upper end of the drop tube.

* * * * *